(12) United States Patent
Wu et al.

(10) Patent No.: US 6,653,204 B1
(45) Date of Patent: Nov. 25, 2003

(54) METHOD OF FORMING A SHALLOW TRENCH ISOLATION STRUCTURE

(75) Inventors: Hsin-Chang Wu, Hsin-Chu (TW); Neng-Hui Yang, Hsin-Chu (TW); Cheng-Yuan Tsai, Yu-Lin Hsien (TW); Wen-Hsun Lin, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/248,749

(22) Filed: Feb. 14, 2003

(51) Int. Cl.[7] .................. H01L 21/76; H01L 21/336; H01L 21/31
(52) U.S. Cl. .................. 438/435; 438/424; 438/296; 438/788
(58) Field of Search .................. 438/435, 424, 438/221, 296, 788

(56) References Cited

U.S. PATENT DOCUMENTS

| 5,731,241 | A | * | 3/1998 | Jang et al. | 438/424 |
| 5,981,402 | A | * | 11/1999 | Hsiao et al. | 438/756 |
| 6,037,018 | A | * | 3/2000 | Jang et al. | 427/579 |
| 6,090,714 | A | * | 7/2000 | Jang et al. | 438/692 |
| 6,191,004 | B1 | * | 2/2001 | Hsiao | 438/435 |
| 6,391,737 | B1 | * | 5/2002 | Ku et al. | 438/401 |
| 6,429,136 | B2 | * | 8/2002 | Miwa | 438/692 |

\* cited by examiner

Primary Examiner—John F. Niebling
Assistant Examiner—Ron Pompey
(74) Attorney, Agent, or Firm—Winston Hsu

(57) ABSTRACT

A pad oxide layer and a silicon nitride (SiN) layer are sequentially formed on a silicon substrate. An etching process is then performed to form a trench in the silicon substrate. A sub-atmospheric chemical vapor deposition (SACVD) process is performed to selectively form a first dielectric layer on exposed portions of the silicon substrate within the trench to fill portions of the trench thereafter. Finally, a high density plasma chemical vapor deposition (HDPCVD) process is performed to form a second dielectric layer to fill the remaining space of the trench and cover the silicon substrate.

11 Claims, 7 Drawing Sheets

METHOD OF FORMING A SHALLOW TRENCH ISOLATION STRUCTURE

BACKGROUND OF THE INVENTION

1. Field of the Invention

The present invention relates to a method of forming a shallow trench isolation (STI) structure, and more specifically, to a method of forming a STI structure with the trench filled by a first dielectric layer formed by a-sub-atmospheric chemical vapor deposition (SACVD) process and a second dielectric layer formed by a high density plasma chemical vapor deposition (HDPCVD) process.

2. Description of the Prior Art

In semiconductor processes, in order to provide good electrical isolation, and to prevent short-circuiting between electric devices on a wafer, a localized oxidation isolation (LOCOS) process, or a shallow trench isolation (STI) process is used to insolate and protect devices. Since the field oxide layer of the LOCOS process consumes a good deal of area on the wafer, and bird's beak can occur when growing the field oxide, an STI process is typically used in the semiconductor processes when the line width is below 0.25 μm. An STI process involves first forming a shallow trench between each device, and then filling the trench with an insulating material to obtain an electrical isolation effect between each device.

Please refer to FIG. 1 to FIG. 3 of schematic views of forming a shallow trench isolation (STI) structure according to the prior art. As shown in FIG. 1, a pad oxide layer 12 is formed on a surface of a silicon substrate 10, and a silicon nitride (SiN) layer 14 is then formed to cover the pad oxide layer 12.

As shown in FIG. 2, a patterned hard mask layer 16 is then formed on the surface of the silicon substrate 10. By performing an etching process, portions of the silicon nitride layer 14, the pad oxide layer 12 and the substrate 10 not covered by the hard mask layer 16 are removed to form a trench 18 in portions of the silicon substrate 10 not covered by the hard mask layer 16. As shown in FIG. 3, finally, the hard mask layer 16 is removed, and a high density plasma chemical vapor deposition (HDPCVD) process is performed thereafter to deposit a dielectric layer 20, composed of silicon oxide, to fill the trench 18 and cover the silicon substrate 10, finishing the fabrication of the STI structure according to the prior art.

As semiconductor technology progresses, manufacturing line width decreases as well, even down to less than 0.13 microns. However, as shown in FIG. 3, since the HDPCVD process employed in the prior art is a deposition process with low selectivity, the deposition rate of silicon oxide on exposed portions of the silicon substrate 10 within the trench 18 is similar to that on exposed portions of either the silicon nitride layer 14 or the pad oxide layer 12 within the trench 18. Therefore, potions of the dielectric layer 20 deposited on a top surface of the silicon nitride layer 14 and on exposed portions of either the silicon nitride layer 14 or the pad oxide layer 12 within the trench 18 frequently overhang from the upper corners of the trench 18 and seal the trench 18 before the trench 18 is fully filled with the dielectric layer 20, forming a void 22 within the trench 18, as an aspect ratio of the trench 18 is greater than 4.0. The void 22 caused by this overhang phenomenon would lead to a defective electrical performance and a poor reliability of the device. As a result, the production yield rate of the product is seriously reduced, making the product less competitive.

SUMMARY OF THE INVENTION

It is therefore a primary object of the present invention to provide a method of forming a shallow trench isolation (STI) structure so as to prevent defective electrical performance of the device caused by a void formed in the trench.

According to the claimed invention, a pad oxide layer and a silicon nitride layer are sequentially formed on a silicon substrate. A patterned hard mask layer on a surface of the silicon substrate, and an etching process is performed to form the trench in portions of the silicon substrate not covered by the hard mask. The hard mask layer is then removed, and a sub-atmospheric chemical vapor deposition (SACVD) process is performed to selectively deposit a first dielectric layer on exposed portions of the silicon substrate within the trench. Finally, a high density plasma chemical vapor deposition (HDPCVD) process is performed to deposit a second dielectric layer on the silicon substrate.

It is an advantage of the present invention against the prior art that the present invention utilizes the SACVD process with high selectivity to deposit the first dielectric layer in the trench. Since the deposition rate of silicon oxide on exposed portions of the silicon substrate within the trench is much higher than that on exposed portions of either the silicon nitride layer or the pad oxide layer within the trench, the first dielectric layer is only deposited on exposed portions of the silicon substrate within the trench. As a result, an overhang phenomenon revealed in the prior art is prevented, and no voids would be formed in the trench to reduce electrical performance of the device, even the manufacturing line width is less than 0.13 microns and an aspect ratio of the trench is greater than 4.0. Consequently, the reliability of the product is assured, and the production yield rate is improved as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
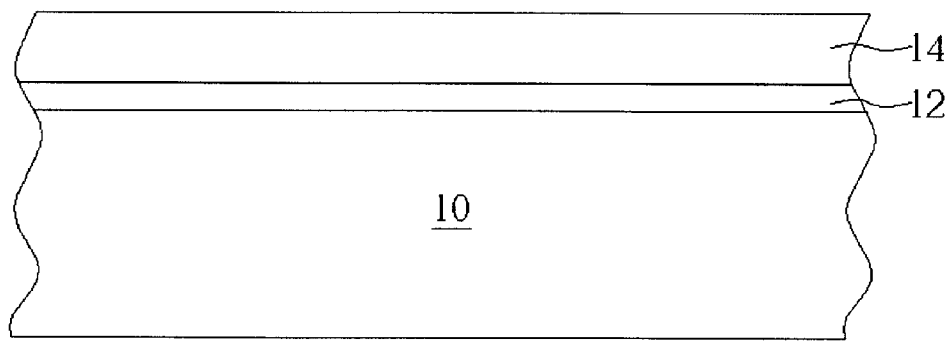
FIG. 1 to FIG. 3 are schematic views of forming a shallow trench isolation (STI) structure according to the prior art.
Figure 2:
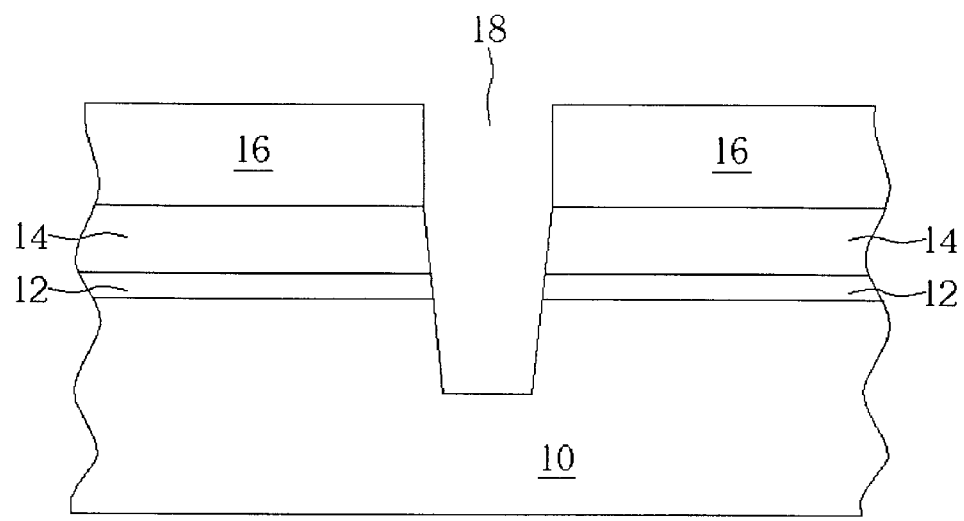
Figure 3:
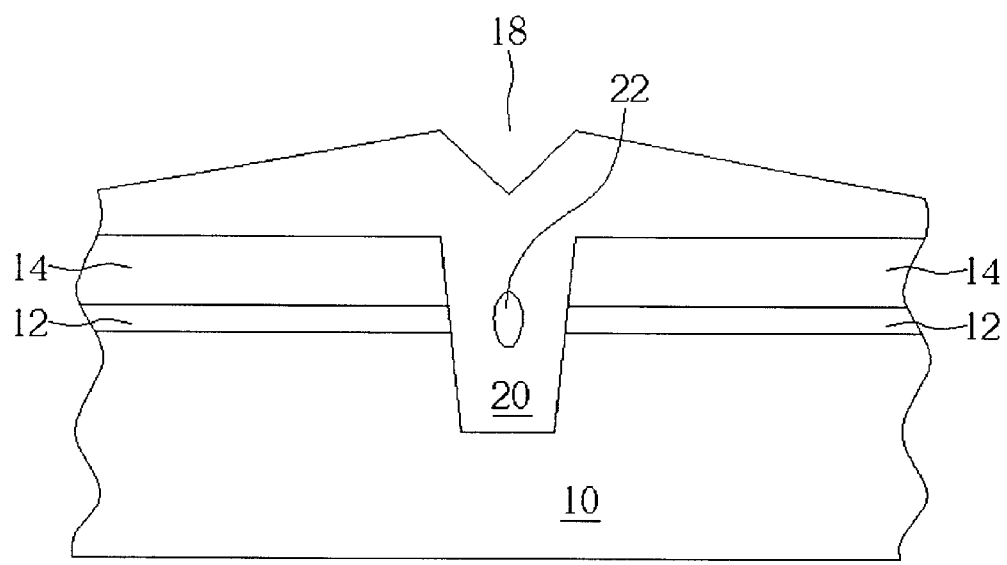
Figure 4:
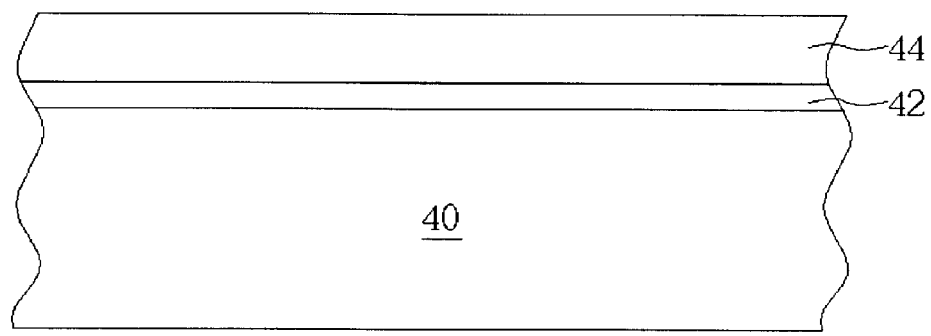
FIG. 4 to FIG. 7 are schematic views of forming a STI structure according to the present invention.

Please refer to FIG. 4 to FIG. 7 of schematic views of forming a shallow trench isolation (STI) structure according to the present invention. As shown in FIG. 4, a pad oxide layer 42 is formed on a surface of a silicon substrate 40, and a silicon nitride (SiN) layer 44 is then formed to cover the pad oxide layer 42.

Figure 5:
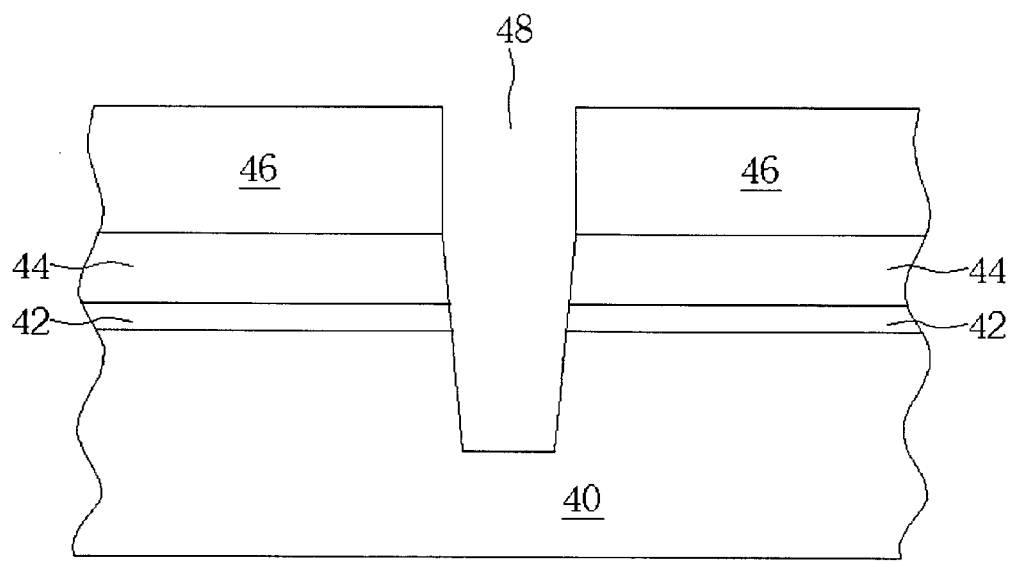

As shown in FIG. 5, a patterned hard mask layer 46 is then formed on the surface of the silicon substrate 40. By performing an etching process, portions of the silicon nitride layer 44, the pad oxide layer 42 and the substrate 40 not covered by the hard mask layer 46 are removed to form a trench 48 in portions of the silicon substrate 40 not covered by the hard mask layer 46. In another embodiment of the present invention, the trench 48 shown in FIG. 5 can be alternatively formed by performing the etching process to remove portions of the silicon nitride layer 44 not covered by the hard mask layer 46, removing the hard mask layer 46, forming a second hard mask layer (not shown) on the pad oxide layer 42 and performing a second etching process to remove portions of the pad oxide layer 42 and the substrate 40 not covered by the second hard mask layer.

Figure 6:
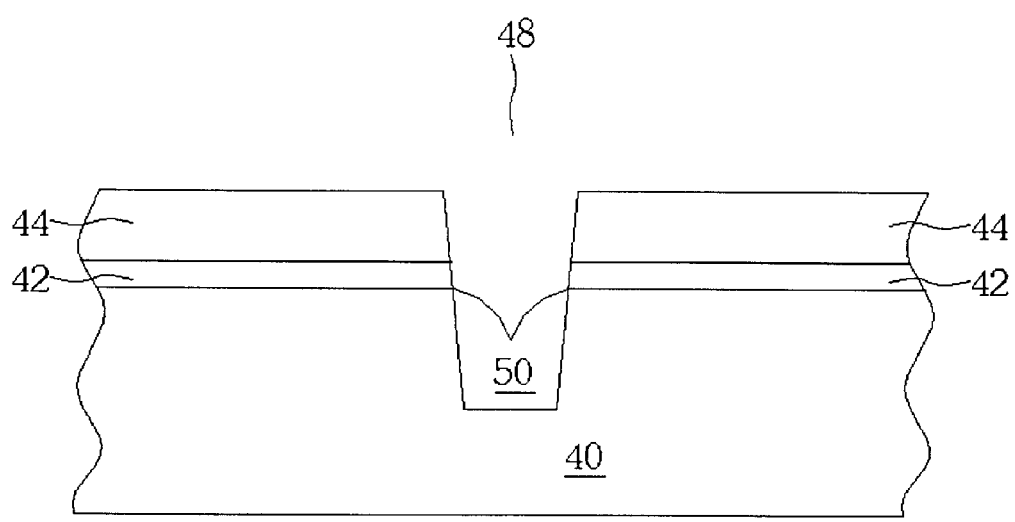

As shown in FIG. 6, the hard mask layer 46 is then removed, and a sub-atmospheric chemical vapor deposition (SACVD) process is performed form a first dielectric layer 50, comprising silicon oxide, in the trench 48. Since the SACVD process is a deposition process with high selectivity, the deposition rate of silicon oxide on exposed portions of the silicon substrate 40 within the trench 48 is much higher than that on exposed portions of either the silicon nitride layer 44 or the pad oxide layer 42 within the trench 48. As a result, the first dielectric layer 50 is selectively deposited only on exposed portions of the silicon substrate 40 within the trench 48. Alternatively, in another embodiment of the present invention, the SACVD process can be replaced by an atmospheric pressure chemical vapor deposition (APCVD) process.

Figure 7:
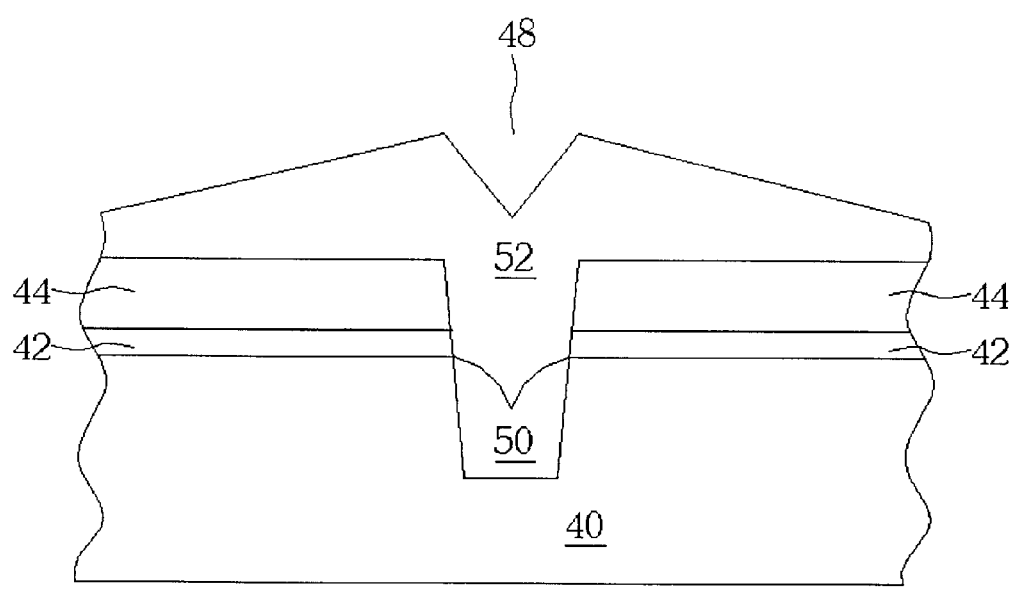

As shown in FIG. 7, a high density plasma chemical vapor deposition (HDPCVD) process is then performed to deposit a second dielectric layer 52, comprising silicon oxide, to fill portions of the trench 48 not covered by the first dielectric layer 50 and cover the silicon substrate 40. In the preferred embodiment of the present invention, the second dielectric layer 52 is a silane based ($SiH_4$-based) silicon oxide layer. Alternatively, in another embodiment of the present invention, the second dielectric layer 52 is a tetra-ethyl-ortho-silicate based (TEOS-based) silicon oxide layer.

Finally, an annealing process is performed to repair the structure of the second dielectric layer 52 so as to tighten the second dielectric layer 52 and finish the fabrication of the STI structure according to the present invention.

In comparison with the prior art, the present invention utilizes the SACVD process with high selectivity to deposit the first dielectric layer 50 in the trench 48. Since the deposition rate of silicon oxide on exposed portions of the silicon substrate 40 within the trench 48 is much higher than that on exposed portions of either the silicon nitride layer 44 or the pad oxide layer 42 within the trench 48, the first dielectric layer 50 is only deposited on exposed portions of the silicon substrate 40 within the trench 48. As a result, an overhang phenomenon revealed in the prior art is prevented, and no voids would be formed in the trench 48 to reduce electrical performance of the device, even the manufacturing line width is less than 0.13 microns and an aspect ratio of the trench 18 is greater than 4.0. Consequently, the reliability of the product is assured, and the production yield rate is improved as well.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming a shallow trench isolation (STI) structure comprising:
   providing a silicon substrate;
   sequentially forming a pad oxide layer and a silicon nitride layer on the silicon substrate;
   forming a patterned hard mask layer on a surface of the silicon substrate;
   performing an etching process to form a trench in portions of the silicon substrate not covered by the hard mask layer;
   removing the hard mask layer;
   performing a sub-atmospheric chemical vapor deposition (SACVD) process to selectively deposit a first dielectric layer on exposed portions of the silicon substrate within the trench; and
   performing a high density plasma chemical vapor deposition (HDPCVD) process to deposit a second dielectric layer on the silicon substrate.

2. The method of claim 1 wherein an annealing process is performed to repair the second dielectric layer after the HDPCVD process is performed.

3. The method of claim 1 wherein the first dielectric layer comprises a silicon oxide layer.

4. The method of claim 1 wherein the second dielectric layer comprises a silicon oxide layer.

5. The method of claim 4 wherein the second dielectric layer comprises a silane-based ($SiH_4$-based) silicon oxide layer.

6. A method of preventing a void within a dielectric layer in a trench, the trench being formed in a silicon substrate, the silicon substrate comprising a pad oxide layer and a silicon nitride layer sequentially formed atop the silicon substrate, the method comprising:
   performing a chemical vapor deposition (CVD) process to selectively deposit the dielectric layer on exposed portions of the silicon substrate within the trench; and
   performing a HDPCVD process to deposit a material layer on the silicon substrate.

7. The method of claim 6 wherein an annealing process is performed to repair the material layer after the HDPCVD process is performed.

8. The method of claim 6 wherein the CVD process comprises either a SACVD process or an atmospheric pressure chemical vapor deposition (APCVD) process.

9. The method of claim 6 wherein the dielectric layer comprises a silicon oxide layer.

10. The method of claim 6 wherein the material layer comprises a silicon oxide layer.

11. The method of claim 10 wherein the material layer comprises a $SiH_4$-based silicon oxide layer.

* * * * *